United States Patent [19]

Geil et al.

[11] Patent Number: 4,833,659

[45] Date of Patent: May 23, 1989

[54] SONAR APPARATUS

[75] Inventors: Frederick G. Geil, Annapolis; Henry M. Gruen, Arnold; Howard S. Newman; Thomas J. Ratz, both of Annapolis; Linwood M. Rowe, Jr.; John H. Thompson, both of Severna Park, all of Md.

[73] Assignee: Westinghouse Electric Corp., Pittsburgh, Pa.

[21] Appl. No.: 686,804

[22] Filed: Dec. 27, 1984

[51] Int. Cl.[4] .............................................. H01L 41/08

[52] U.S. Cl. .................................... 367/155; 367/165; 310/332

[58] Field of Search ............... 367/155, 161, 162, 165, 367/143, 154; 310/331–335

[56] References Cited

U.S. PATENT DOCUMENTS

| | | | |
|---|---|---|---|
| 3,158,762 | 11/1964 | Horan | 367/161 |
| 3,243,768 | 3/1966 | Roshow, Jr. et al. | 367/155 |
| 3,249,912 | 5/1966 | Straube | 367/161 |
| 3,336,529 | 8/1967 | Tygart | 310/331 |
| 3,354,426 | 11/1967 | Massa | 367/161 |
| 3,370,Г87 | 2/1968 | Straube | 367/161 |
| 3,382,841 | 5/1968 | Bouyoucos | 367/143 |
| 3,421,137 | 1/1969 | Rathbun, Jr. | 367/1 |
| 3,458,857 | 7/1969 | Hanks et al. | 367/155 |
| 3,489,932 | 1/1970 | Kope et al. | 367/162 |
| 3,988,620 | 10/1976 | McDavid | 367/155 |
| 4,017,824 | 4/1977 | Fife et al. | 367/155 |
| 4,051,455 | 9/1977 | Fowler | 367/155 |
| 4,191,904 | 3/1980 | Massa | 310/335 |
| 4,330,730 | 5/1982 | Kurz et al. | 310/331 |
| 4,339,683 | 7/1982 | Scott et al. | 310/364 |
| 4,349,762 | 9/1982 | Kitamura et al. | 310/331 |
| 4,419,599 | 12/1983 | Micheron | 310/332 |
| 4,431,873 | 2/1984 | Dunn et al. | 367/165 |
| 4,469,976 | 9/1984 | Scott | 310/365 |
| 4,473,769 | 9/1984 | Nguyen | 310/334 |

*Primary Examiner*—Salvatore Cangialosi
*Attorney, Agent, or Firm*—D. Schron

[57] ABSTRACT

A hydrophone array wherein each individual hydrophone of the array is comprised of, e.g. polyvinylidine fluoride ($PVF_2$), tiles bonded to a substrate member opposite one another on opposite surfaces of the substrate. The substrate is a relatively stiff, metallic member having a Young's modulus of at least an order of magnitude greater than the $PVF_2$ tiles which are oriented such that their stretch directions on either side of the substrate are parallel to one another. The directions of polarization of the tiles are either the same or opposite and electrical connections are made such that for a predetermined relative orientation of the directions of polarization, any output signal which may be caused by flexing or acceleration of the substrate is substantially reduced or eliminated.

16 Claims, 12 Drawing Sheets

SONAR APPARATUS

BACKGROUND OF THE INVENTION

1. Field of the Invention:

The invention in general relates to sonar hydrophones, and in particular to a large conformable hydrophone array for use with beam forming apparatus.

2. Description of the Prior Art:

A need exists for a sonar system to precisely detect distant underwater targets without the requirement for an active transmission of an acoustic pulse. The need is met by a passive array of hydrophones in conjunction with beam forming apparatus to pinpoint target location based upon the self-noise generated by the target.

Generally, the larger the array aperture the greater will be its ability to accurately determine target location. If the array is carried by an underwater vessel such as a submarine, the array should be conformable to the submarine shape so as not to interfere with its hydrodynamic design.

Conformable arrays have been built utilizing individual piston-type hydrophones having a piezo ceramic active element. For extremely large arrays, however, such construction is prohibitively heavy, and the active elements are subject to breakage in the presence of a shock wave. In addition, such array is reflective of incident acoustic energy thereby making it easily detectable.

To obviate these shortcomings, there has been proposed an array made up of relatively flat flexible piezoelectric elements of a piezoelectric polymer such as polyvinylidene flouride ($PVF_2$). The $PVF_2$ elements forming the array are lightweight, shockproof and flexible so as to conform to a curved base structure. The use of such flexible elements, however, has produced less than satisfactory results over the frequency range desired for detecting distant targets. The response and beam patterns formed utilizing the $PVF_2$ elements have not been in conformance with theoretical expectations and this behavior is unacceptable for controlled beamformer operation.

The hydrophone array of the present invention utilizes lightweight, flexible piezoelectric elements in a structure which minimizes inter-element coupling, has uniform and high element sensitivity, controlled element beam patterns, has little element-to-element variation and is acoustically transparent.

SUMMARY OF THE INVENTION

The apparatus of the present invention provides for an array of transducers, with each transducer of the array including a relatively thin, stiff substrate member, first and second relatively flexible piezoelectric elements each having a certain direction of polarization with each element having means for making electrical connection on opposed surfaces thereof.

The first and second piezoelectric elements are affixed to the substrate member opposite one another on opposite sides thereof and conductors are electrically connected to the elements for deriving an output signal when the elements are stressed. The conductors have a certain connection with the elements such that for a predetermined relative orientation of the directions of polarization, the output signal will be minimal when one of the elements is in tension and the other is compression due to any bending or acceleration of the substrate member.

The relatively flexible piezoelectric elements have a Young's modulus which is much less than that of the stiff substrate member, which exhibits a Young's modulus of at least an order of magnitude greater than that of the piezoelectric element. In order to further minimize any incompletely cancelled output signal caused by flexural resonances of the substrate member, the substrate member may have a multi-laminar structure with at least one of the laminar layers being of a viscoelastic damping material.

DESCRIPTION OF THE PREFERRED EMBODIMENT

Figure 1:
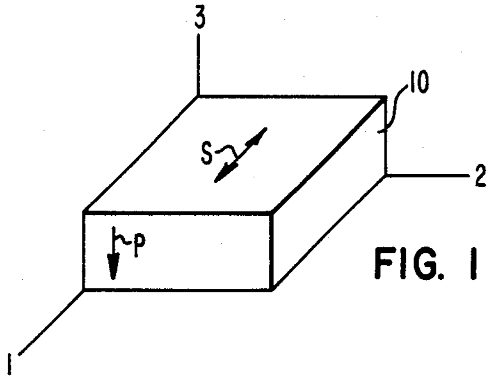
FIG. 1 illustrates a block of piezoelectric polymer material oriented in a 1, 2, 3 axis coordinate system.

In FIG. 1 a slab of piezoelectric material 10 is illustrated in a three-axis coordinate system wherein the axes are labeled 1, 2 and 3. As is common, the term piezoelectric is utilized herein to refer to a polymer material which exhibits a piezoelectric effect, one such material being polyvinylidine fluoride. When the material is stressed mechanically, a corresponding electric charge is generated, and with properly applied electrodes a corresponding voltage is produced. This characteristic of the material is accomplished by initially polarizing the material during fabrication. In FIG. 1, the direction of polarization is represented by arrow P parallel to the 3 axis. The polarization is established by a high DC voltage that is applied between a pair of electroded faces on top and on bottom of the slab 10. For polyvinylidine fluoride, the material may be additionally stretched while undergoing polarization, with the stretch direction in FIG. 1 being depicted by the doubled-ended arrow S parallel to the 1 axis.

Figure 2:
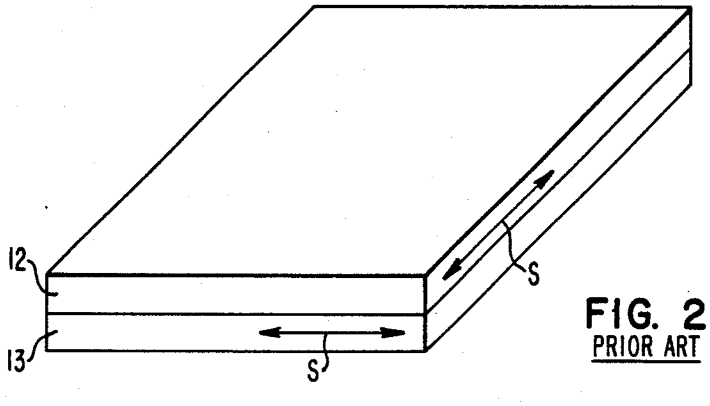
FIG. 2 PRIOR ART
FIGS. 2 and 3 illustrate prior art hydrophone elements.

FIG. 2 illustrates a prior art hydrophone transducer in the form a sandwich made up of two back-to-back $PVF_2$ tiles having electrodes on the flat surfaces thereof. For a force applied in the direction of the 3 axis (FIG. 1) the strain along the 1 and 2 axes are different, unlike conventional piezoelectric materials wherein the lateral strains (and responses) are substantially the same. In order to achieve lateral homogeneity, the tiles are oriented such that their stretch directions represented by the double-ended arrows S are perpendicular to one another.

Figure 3:
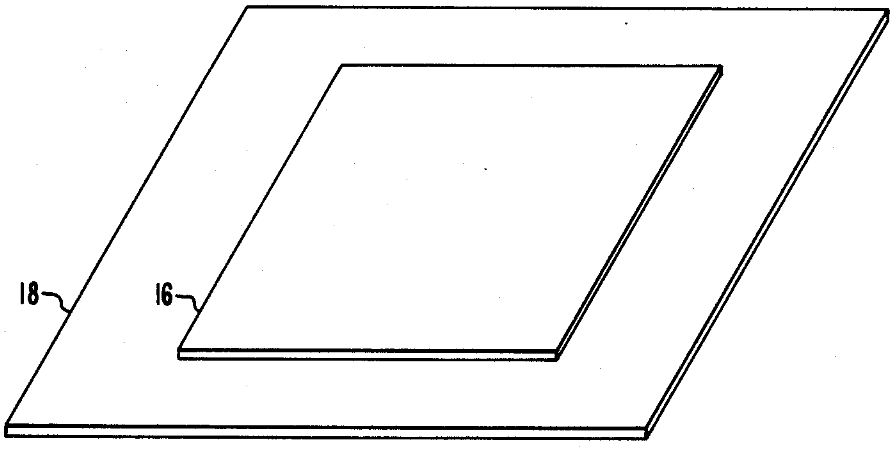
FIG. 3 PRIOR ART

FIG. 3 illustrates another prior art arrangement wherein a $PVF_2$ tile 16 is affixed to a thin plate 18 in order to reduce lateral sensitivity.

Figure 4A:
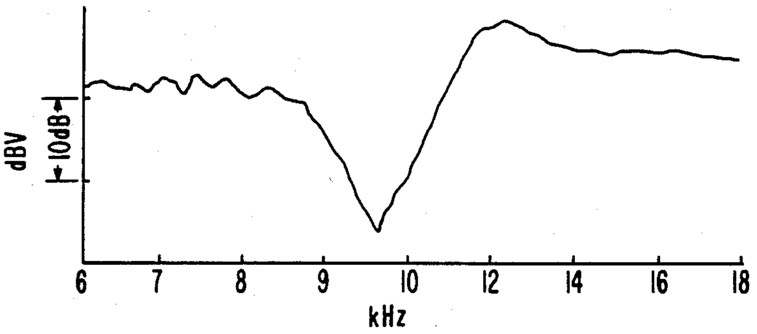
FIGS. 4A and 4B illustrate free-field voltage sensitivities for the prior art devices and FIG. 4C illustrates it for the invention of the present invention.

The prior art structures such as illustrated in FIGS. 2 and 3, as well as variations, exhibit unacceptable operation in response to acoustic energy, over a frequency range of interest. For example, FIG. 4A illustrates the free-field voltage sensitivity for the transducer arrangement of FIG. 2. The sensitivity is measured as a function of frequency, plotted on the horizontal scale, while the output open circuit voltage (decibels relative to 1 volt) is plotted on the vertical scale. Ideally, the response should be the same for all frequencies. That is, the curve should be horizontal. Results of testing of the element of FIG. 2, however, reveal a jagged response up to about 8.8 kHz after which the curve takes a large dip reaching a minimum at about 9.8 kHz after which a maximum is reached at approximately 12.5 kHz and thereafter levels out.

Figure 4B:
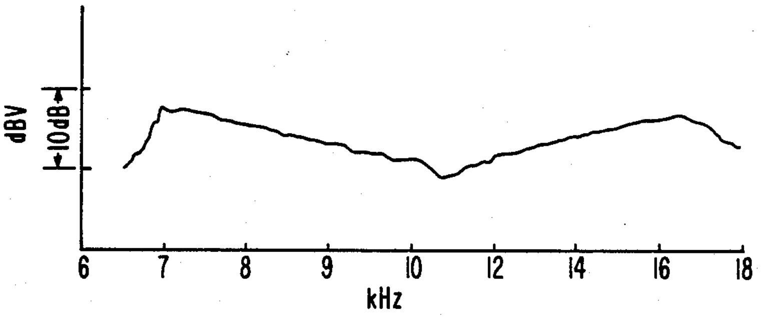

The sensitivity of the arrangement of FIG. 3 is illustrated in FIG. 4B which, although the large dip of FIG. 4A is not present, the curve still includes objectionable variations, with the maximum to minimum sensitivity being approximately 9 dB.

Figure 4C:
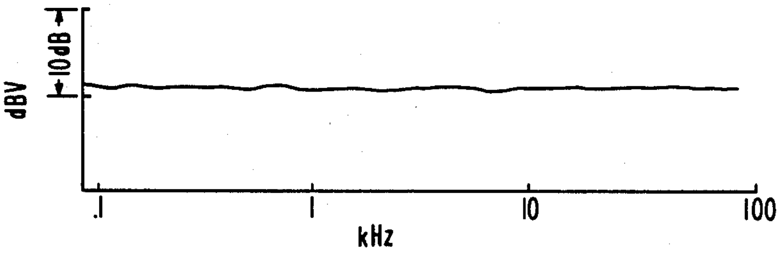

FIG. 4C illustrates the free-field voltage sensitivity results of a test on a transducer constructed in accordance with one embodiment of the present invention. Test results plotted in FIG. 4C reveal a variation of only approximately $\pm 1$ dB not only over the frequency range illustrated in FIGS. 4A and 4B, but over a frequency range from below 100 Hz to above 100 kHz. An embodiment of the present invention is illustrated in FIG. 5 to which reference is now made.

Figure 5:
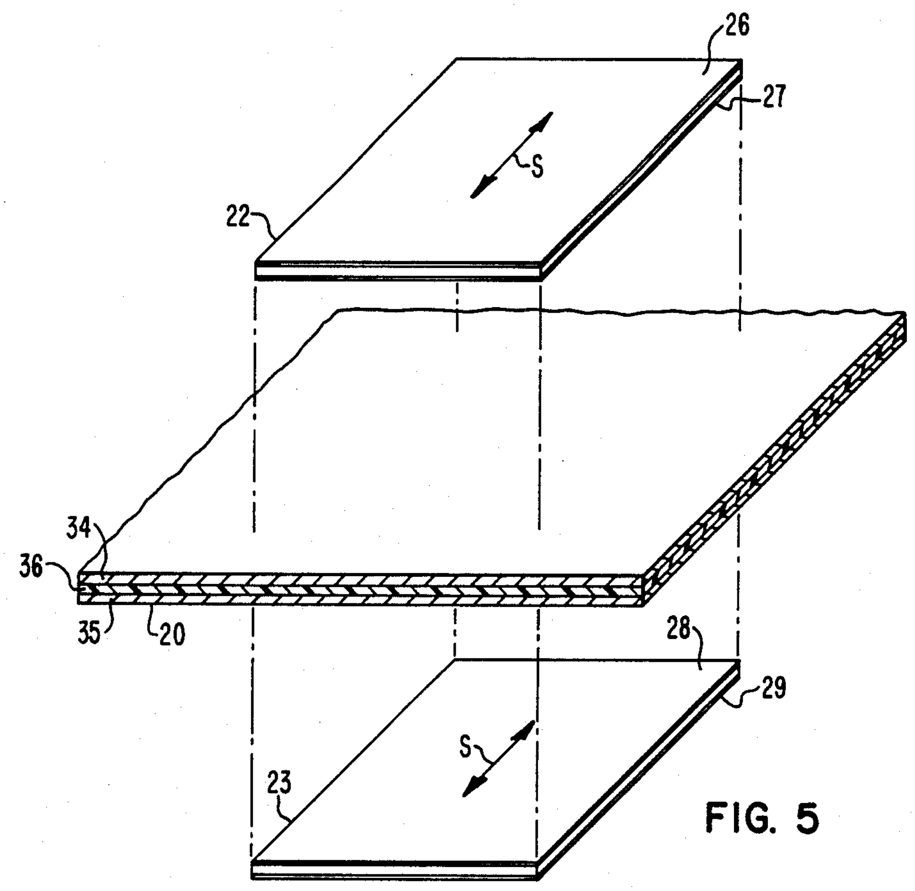
FIG. 5 is an exploded view of one embodiment of the present invention.

FIG. 5 illustrates in exploded view, a single transducer hydrophone of an array of many such units. The transducer includes a thin, relatively stiff central plate 20 forming a substrate member for first and second piezoelectric polymer members 22 and 23 affixed to the member 20 opposite one another on opposite surfaces thereof. Piezoelectric polymer members 22 and 23 are in the form of tiles, and if made of a material which is stretched while being polarized, such as $PVF_2$, are oriented such that their stretch directions denoted by arrows S are parallel to one another as opposed to being crossed (as in FIG. 2).

Piezoelectric member 22 includes electrodes 26 and 27 on opposite flat surfaces thereof and member 23 includes similar electrodes 28 and 29. In a preferred embodiment, these electrodes are a metal foil such as copper to aid in constraining lateral response of the piezoelectric members.

The central plate 20 forming the substrate member for the piezoelectric elements may be of stiff metal such as aluminum or steel (for which the data of FIG. 4C was obtained) or may be of a multi-laminar construction as illustrated in FIG. 5. More specifically, substrate member 20 includes two metal outer layers 34 and 35 which sandwich a central viscoelastic damping material 36.

Figure 6:
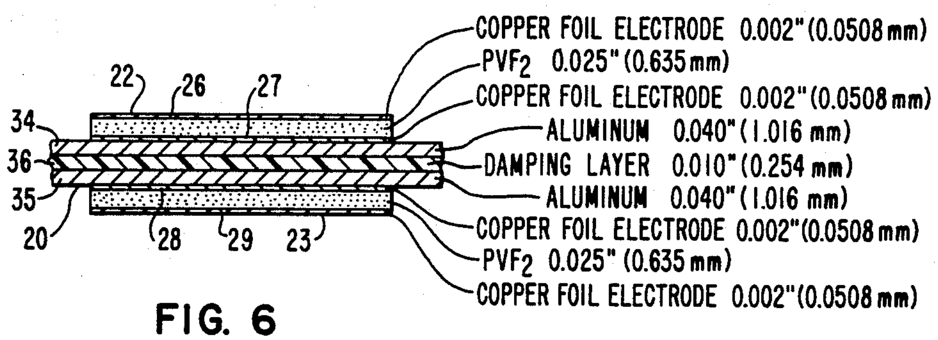
FIG. 6 is an end sectional view of the hydrophone element of FIG. 5 and illustrates typical thicknesses of the various elements.

FIG. 6 illustrates a cross-sectional end view of a single hydrophone element such as illustrated in FIG. 5 and lists by way of example materials and thicknesses for a square piezoelectric polymer tile 2.5 inches (63.5 mm) on a side.

Figure 7:
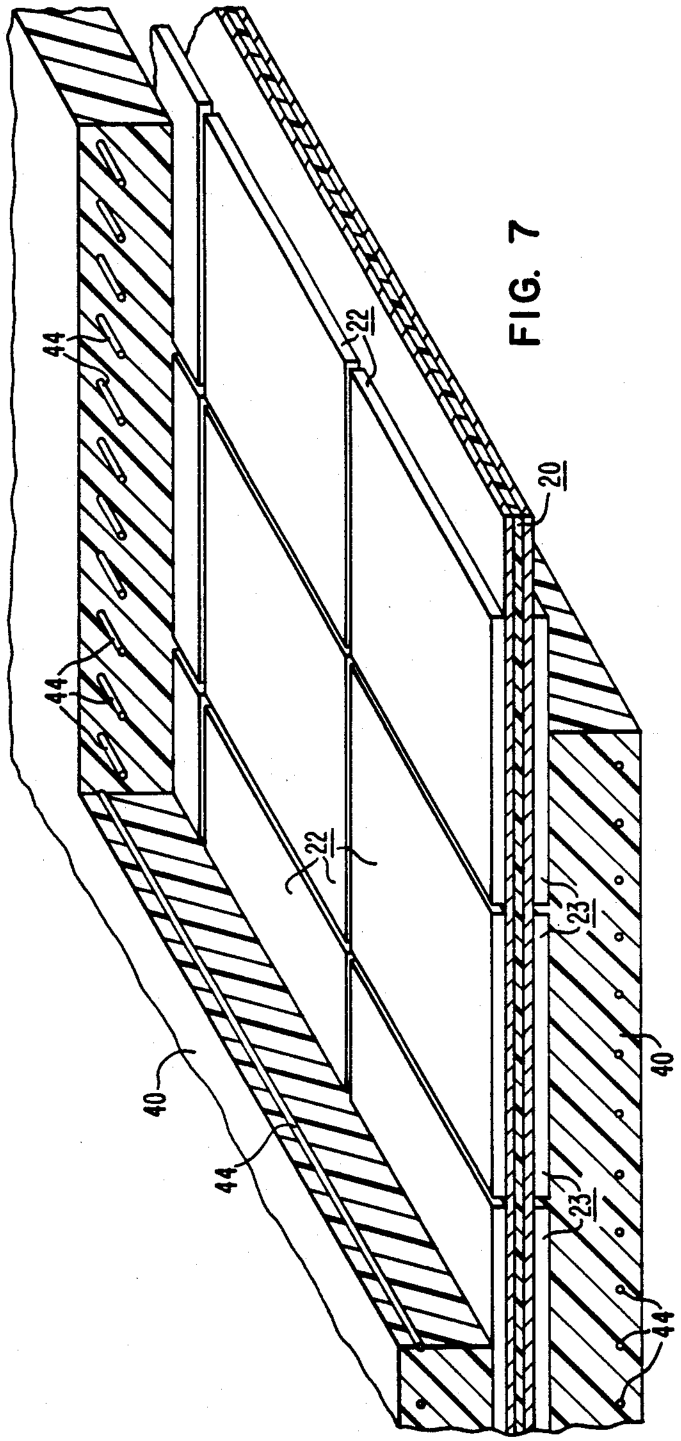
FIG. 7 is a view with portions broken away of an array in accordance with the present invention.

The individual hydrophone transducers are utilized in an array, a portion of which is illustrated in FIG. 7, with portions broken away. A plurality of first piezoelectric polymer active elements 22 are affixed to the substrate member 20 on one side thereof such as by an extremely thin film of rigid epoxy or other adhesive, while a corresponding number of second piezoelectric polymer active elements 23 are similarly affixed to the other side, with each being opposite a corresponding element of the first plurality, and with opposed elements having parallel stretch directions for $PVF_2$ tiles.

The individual hydrophones thus formed, and constituting part of an array, are encapsulated in a potting material 40 such as polyurethane which is transparent to acoustic waves.

As will be explained, the outside electrodes of the piezoelectric polymer elements 22 and 23 are electrically connected to a preamplifier for deriving a signal indicative of the impingement of acoustic energy. In view of the electrical connection wherein the substrate member is electrically at ground potential, it is imperative that the array be shielded from electromagnetic energy such as that which may be even generated as the underwater vessel travels through the water. For this purpose there is provided an electromagnetic interference shield which in one embodiment may take the form of a plurality of metal wires 44 embedded in the potting material 40 above and below the transducer array.

Figure 8:
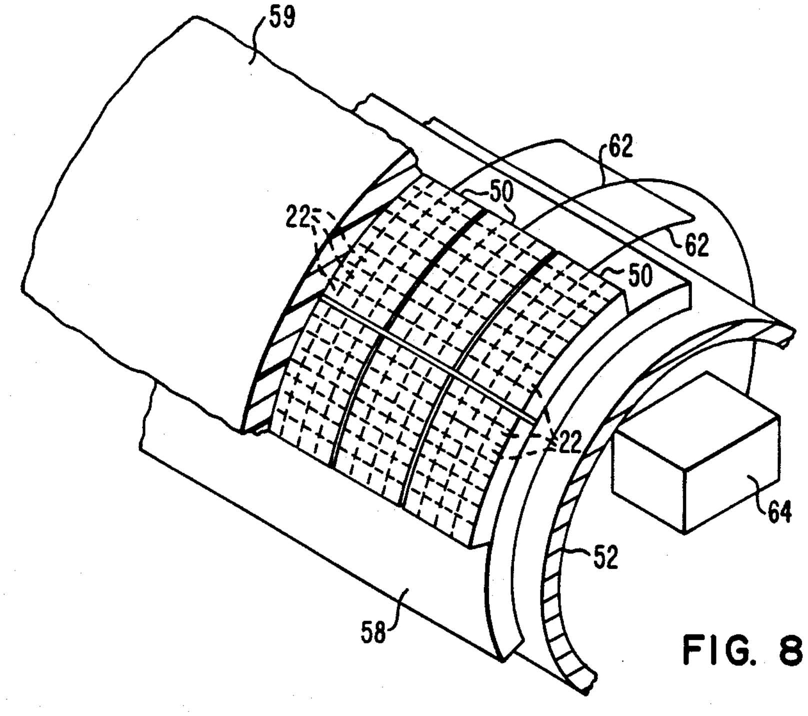
FIG. 8 illustrates a portion of the hydrophone array as it may be mounted on an underwater vessel.

Although the individual elements forming a hydrophone transducer are relatively light, an array of hundreds or even thousands of such transducers formed on a single substrate would be unwieldy. Accordingly, the structure illustrated in FIG. 7 is fabricated as a plurality of more manageable mats or subarrays, several of which, 50, are illustrated in FIG. 8. Due to the flexibility of the $PVF_2$ elements as well as the thinness of the substrate member, each individual mat 50 of the entire array readily conforms to the curvature of hull 52 of the underwater vessel. A typical installation may include inner and outer decouplers 58 and 59 with the inner decoupler including mounting means as well as being functional to prevent signal reflection from the hull back into the array. Outer decoupler 59 would be acoustically transparent, and would separate the mats from turbulent boundary layer noise and afford some protection to the hydrophone array. The structure of the decouplers form no part of the present invention.

The output signal from each of the individual hydrophone elements are collectively provided via electrical connections 62 to standard beamformer apparatus 64 within the vessel so that possible targets may be pinpointed by the formation of multiple relatively narrow receiver beams, as is well known to those skilled in the art.

In view of the fact that a multiplicity of hydrophone transducers all have a common substrate member, objectionable acoustic coupling between elements may occur due to flexure of the substrate member in response to incident acoustic energy.

Figure 9:
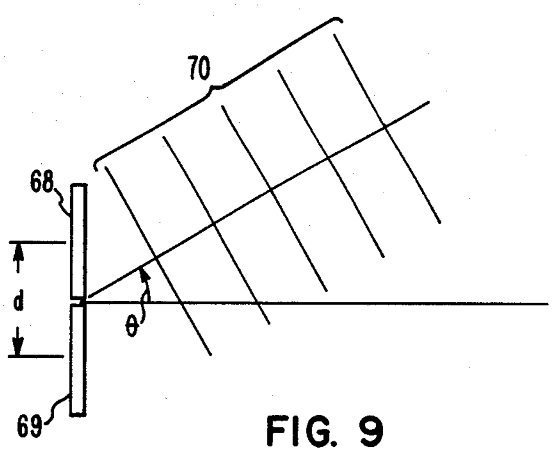
FIG. 9 illustrates two adjacent hydrophone elements with the impingements thereon of acoustic energy.

By way of example, FIG. 9 illustrates piezoelectric polymer elements 68 and 69 (end view), the acoustic centers of which are separate by a distance d. Numeral 70 represents an acoustic signal having a certain frequency and impinging on the two-element array at an angle $\theta$. In an ideal situation, in response to the acoustic signal, each element 68 and 69 will provide an identical output signal, with the signals having a certain phase difference dependent upon the angle $\theta$. That is:

$$\phi=(360d \sin \theta)/\lambda$$

where $\phi$= the phase difference in degrees $\lambda$= the wavelength in water of the acoustic signal d= the distance between the acoustic centers of the elements $\theta$= the impingement angle.

Figure 10:
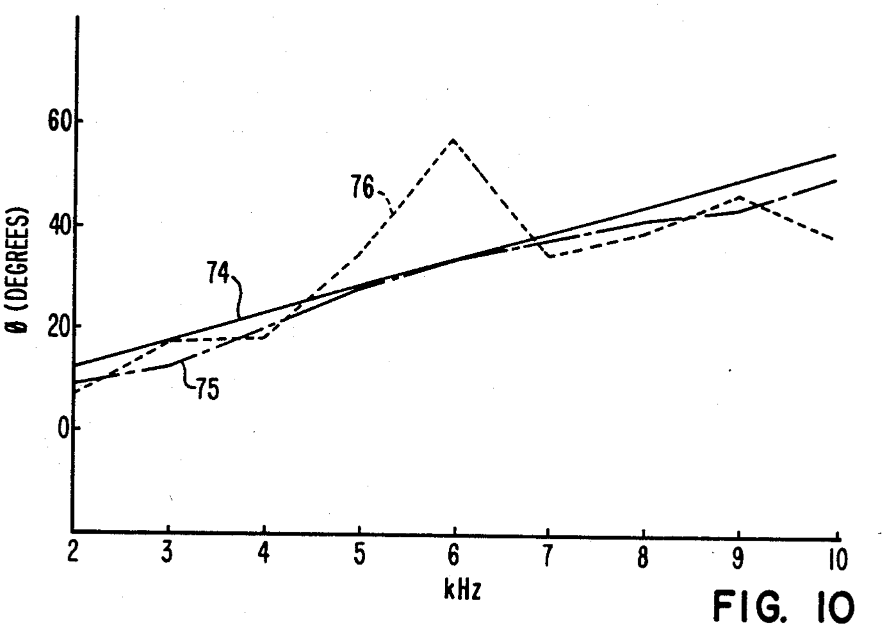
FIG. 10 are curves illustrating the effect of inter-element coupling between adjacent hydrophone elements.

In FIG. 10, frequency is plotted on the horizontal axis and phase difference, $\phi$, is plotted on the vertical axis. Solid line 74 represents the theoretical phase difference as a function of frequency plotted in accordance with the above equation for a representative impingement angle $\theta$ of 45° and an element separation d of 1.25 inches. Dot-dash line 75 illustrates actual test results performed on two adjacent hydrophones on a common substrate as fabricated in accordance with the present invention. The two hydrophones were formed from a single 2.5"×2.5" hydrophone by scoring the exposed electrodes so as to result in two hydrophones, each 1.25"×2.5" with a separation distance d therefore of 1.25". Although there is a slight deviation from the theoretical values depicted by solid line 74, such deviation is well within acceptable limits defined to be ±10° around theoretical. In contrast, dotted line 76 illustrates actual test results performed on two adjacent hydrophones, each having only one tile on a substrate member such as illustrated in FIG. 3. The simulation of this prior art hydrophone was accomplished with the hydrophone pair that produced the results shown by the dot-dash line 75, however with opposed piezoelectric polymer elements electrically disconnected. The results of the test reveal deviations far outside of the allowable ±10° range and, therefore, totally unacceptable for intended use.

Beam formation is accomplished generally with the use of a digital computer which has in its memory the coordinates of the acoustic center of each element of the array. With the results as illustrated by the dotted line 76, the acoustic centers appear to objectionably move around as a function of frequency and, accordingly, would greatly degrade beam forming capability and hence prevent accurate target detectability.

Figure 11:
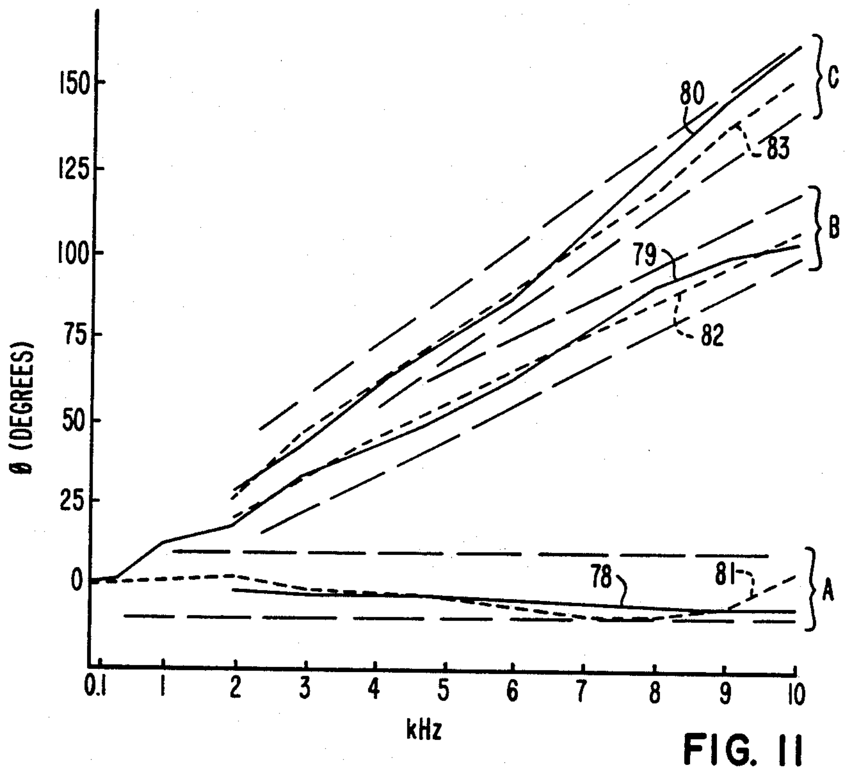
FIG. 11 is similar to FIG. 10 and illustrates the results of tests on a hydrophone built in accordance with the present invention.

Further inter-element coupling tests on pairs of hydrophones in an array, each fabricated in accordance with the present invention and with each being 2.5"×2.5", have been conducted at other impingement angles and at various pressures. The results of such tests are presented in FIG. 11. Solid lines 78, 79 and 80 illustrate the results of testing at zero psi for respective impingement angles of 0°, 45° and 90°, and dotted lines 81, 82 and 83 illustrate the results for a pressure of 500 psi at those same impingement angles. Test results illustrate that the phase variation is well within the ±10° limit as defined by bands A, B and C in FIG. 11.

During operation, impingement of an acoustic signal emanating from a distant target will result in a corresponding output signal from each of the individual hydrophone transducers of the array. The desired output signal, however, is potentially degradable by inclusion of other and undesired signals caused by lateral elongation of the flexible piezoelectric polymer element as well as bending of the substrate member. This latter action, that is, the bending of the substrate member, may be the result of noise, such as vibration conducted via a mounting arrangement or even flexing due to impingement of acoustic energy, which is expected in an acoustically transparent array.

The Young's modulus of the flexible piezoelectric polymer element is at least an order of magnitude less than that of the substrate member to which it is affixed. By way of example, the Young's modulus of $PVF_2$ is approximately $0.4\times10^6$ psi, while that of aluminum is approximately $10\times10^6$ psi, or 25 times as great. For a steel substrate having a Young's modulus of approximately $28\times10^6$ psi, the difference would be even greater. If the polymer and substrate members had equal flexibility, then the substrate member would allow elongation of the piezoelectric polymer member, resulting in an objectionably large and undesired signal component. The difference in stiffness of the two members, however, ensures that the bonding constrains any potential lateral movement of the piezoelectric polymer element, thus reducing such undesired signal.

The most objectionable and unwanted signal components are due to acceleration and/or substrate bending which stresses the piezoelectric polymers such that an output signal would be provided unrelated to target information. The minimization of these components is accomplished by particular electrical connections to the transducer electrodes as a function of the directions of polarizations of the piezoelectric polymer elements. Various connections for eliminating or minimizing these unwanted signal components are illustrated in FIGS. 12A/B/C to 15A/B/C.

Figure 12A:
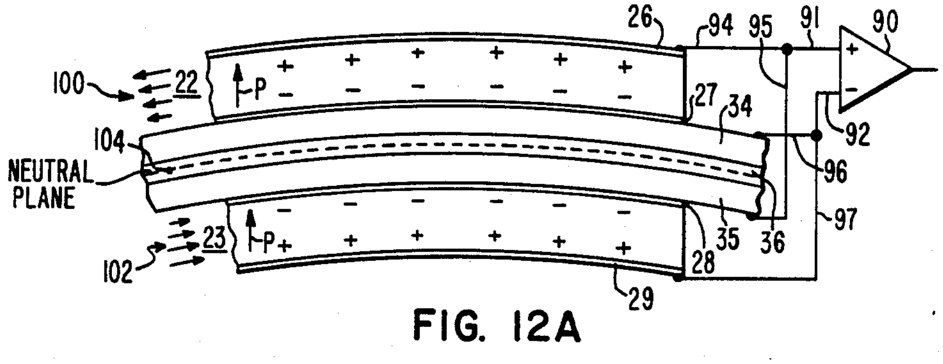
FIGS. 12A/B/C to 15A/B/C illustrate particular directions of polarization together with electrical connections for eliminating or minimizins any unwanted bending or acceleration components in the output signals.
Figure 12B:
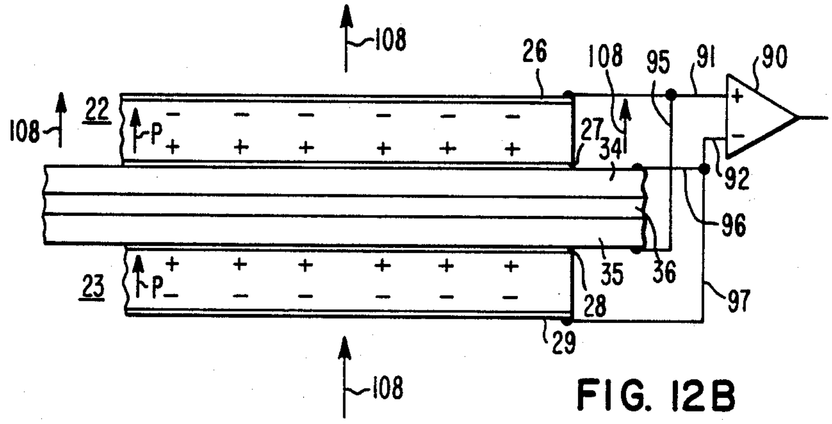
Figure 12C:
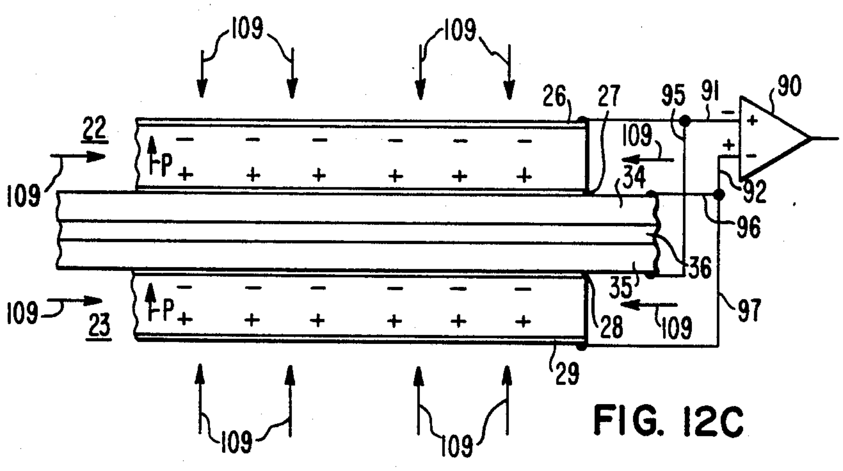

FIGS. 12A, 12B and 12C illustrate the piezoelectric elements 22 and 23 as having their directions of polarizations the same, as depicted by arrows P pointing in the same direction. The elements are connected in parallel to a dual input preamplifier 90 having first and second inputs 91 and 92, with electrodes 26 and 28 being connected to input 91 by means of leads 94 and 95 and electrodes 27 and 29 being connected to input 92 by means of leads 96 and 97. Connection to substrate layers 34 and 35 is, in effect, connection to electrodes 27 and 28 by virtue of the connection, either conductive or capacitive through the epoxy bond of the elements to the substrate.

When the thin substrate 20 is flexed as in FIG. 12A, the top element 22 is in tension as indicated by arrows 100 while the bottom element is in compression as indicated by arrows 102. The point 104 where there is neither tension nor compression lies in the neutral plane separating the top and bottom elements. This stressing causes a voltage to be produced in each of the elements 22 and 23, the polarity of which is indicated by the plus and minus symbols within the elements. With the parallel connection illustrated, the positive-produced voltage at electrode 26 is cancelled by the negative-produced voltage at electrode 28 while the negative-produced voltage at electrode 27 is cancelled by the positive-produced voltage at electrode 29. When flexure is in the reverse direction, the polarities are reversed with the same cancellation results.

When the unit is accelerated as indicated by arrows 108 in FIG. 12B, the top element is in compression, while the bottom element is in tension. The resultant voltages thus produced, and indicated by the plus and minus symbols within the elements, are cancelled such that any signal due to an acceleration of the hydrophone is substantially minimized or eliminated.

In FIG. 12C, arrows 109 represent the hydrostatic, oscillating pressure shown as compression, due to an acoustic signal. In such instance, with the elements having the same directions of polarization and with the same parallel connections as illustrated in FIGS. 12A and 12B, a resultant non-cancelled output voltage will be produced at the inputs of preamplifier 90 which will provide a corresponding output signal indicative of the acoustic signal. It is to be noted that FIG. 12C merely illustrates a single instance of the acoustic signal which, in actuality, is continuously fluctuating.

Figure 13A:
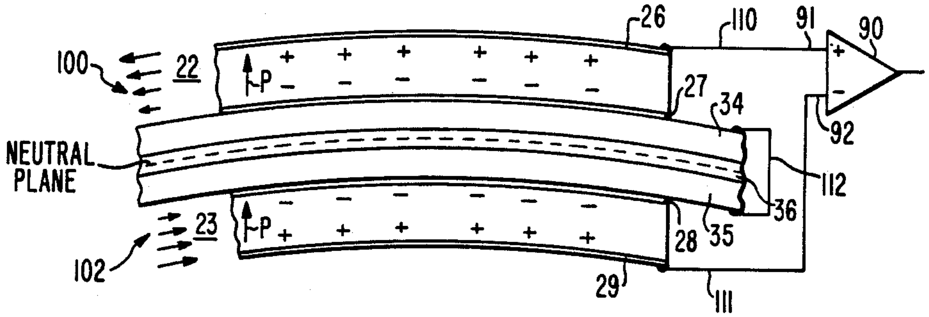
Figure 13B:
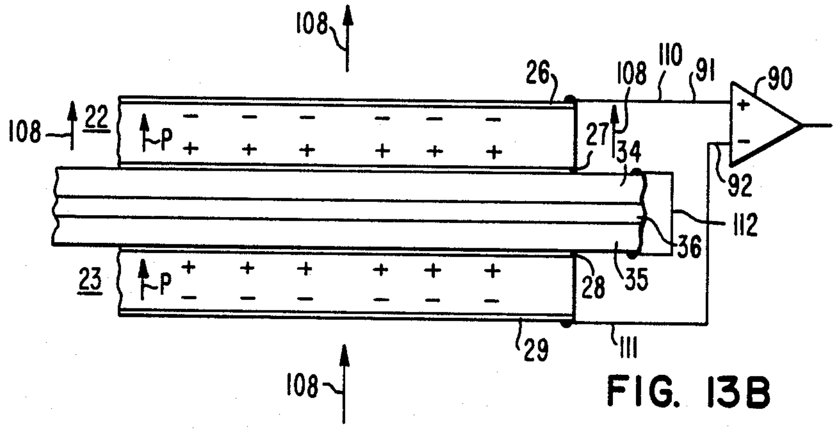
Figure 13C:
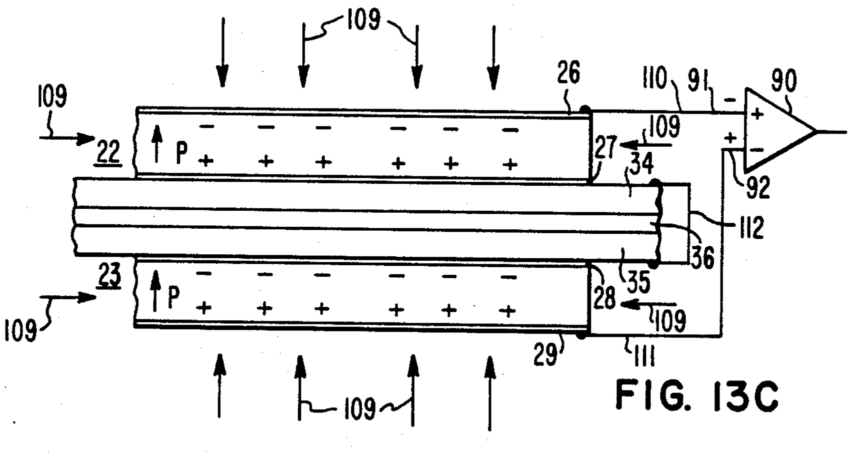

FIGS. 13A, 13B and 13C illustrate the same directions of polarization, however with a series connection of the elements. In this arrangement, electrode 26 is connected to preamplifier input 91 by means of lead 110 while lead 111 connects electrode 29 to input 92. Electrodes 27 and 28 are connected in series by means of jumper 112. The voltages produced as a result of bending or acceleration, and indicated by the plus and minus symbols cancel out at the input to preamplifier 90 when the substrate is in a bending condition as indicated in FIGS. 13A, or an acceleration condition as indicated in FIG. 13B, while the signals are additive resulting in an output from the preamplifier 90 in response to an acoustic signal as indicated in FIG. 13C.

Figure 14A:
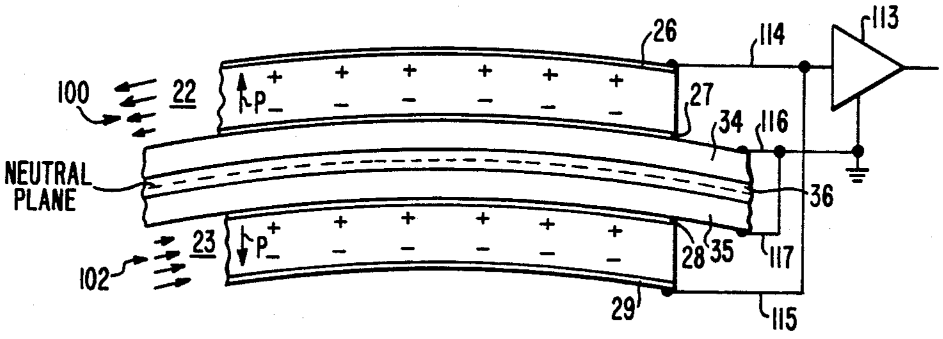
Figure 14B:
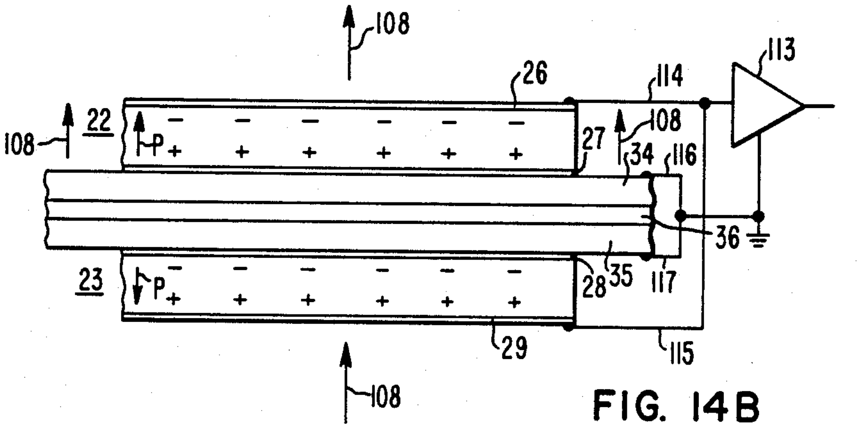
Figure 14C:
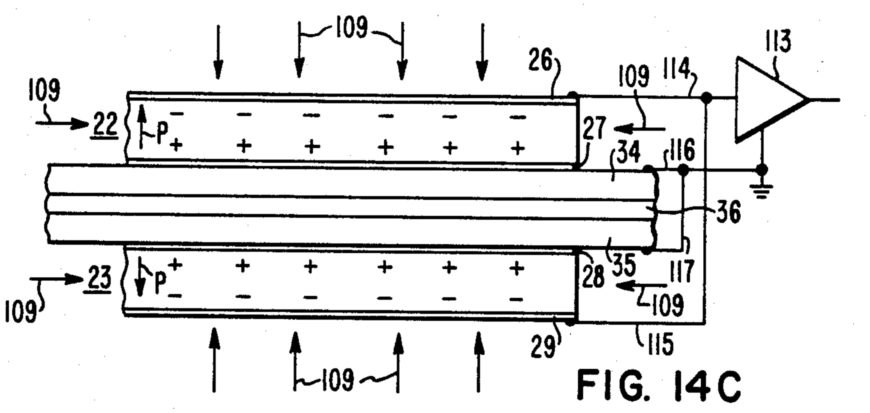

FIGS. 14A, 14B and 14C illustrate the elements as having opposite directions of polarization with parallel connections. For this arrangement and with opposite directions of polarization, electrodes 26 and 29 are connected to the input of a single input preamplifier 113 by means of respective leads 114 and 115 while electrodes 27 and 28 are connected to the electrical ground of preamplifier 113 by means of respective leads 116 and 117. These electrical connections, with the opposite directions of polarization, have the effect of cancelling the bending stress signal as in FIG. 14A and the acceleration signal as in FIG. 14B while allowing for an output in response to the acoustic signal as in FIG. 14C.

Figure 15A:
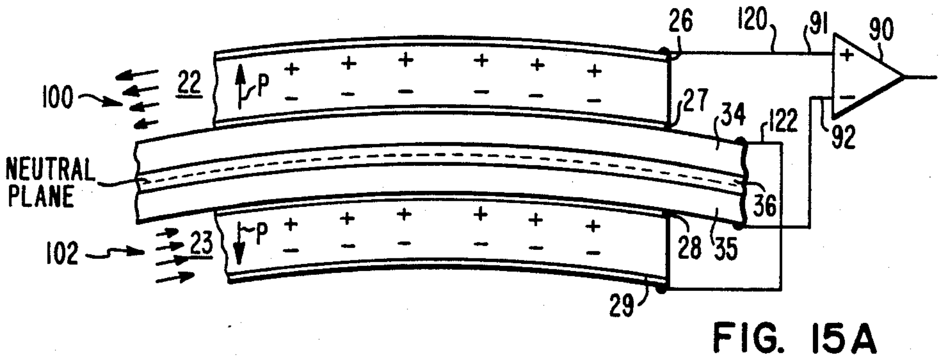
Figure 15B:
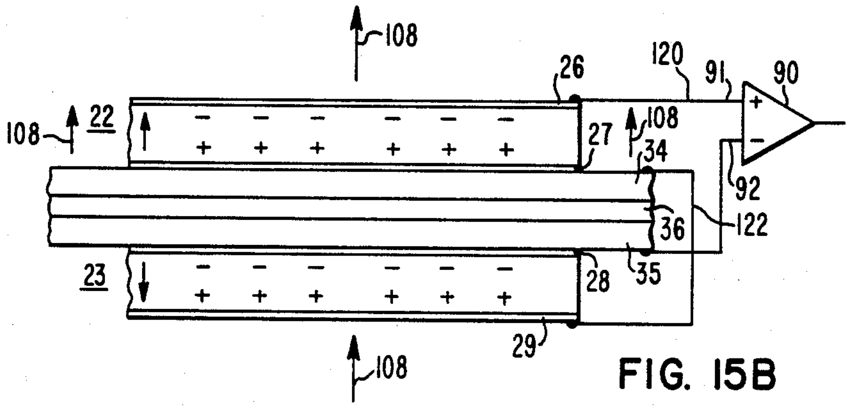
Figure 15C:
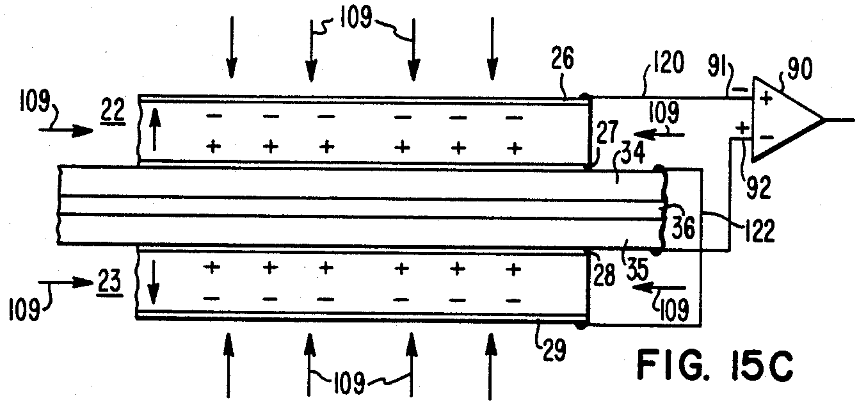

FIGS. 15A, 15B and 15C also show opposite directions of polarization, however with a series connection of the electrodes and a dual input preamplifier 90 as in FIGS. 12 and 13. Thus, bending stress signals and acceleration signals are cancelled by virtue of lead 120 connecting electrode 26 to input 91 and lead 121 connecting electrode 28 to input 92. Electrodes 27 and 29 are series connected by means of lead 122. Examination of the voltage polarities produced during bending, acceleration and in response to an acoustic signal, reveals that for the series connection and opposite directions of polarization, an output is provided in response to the acoustic signal while at the same time outputs due to bending or acceleration stresses are cancelled.

The substrate member in FIGS. 12 to 15 is illustrated as a tri-laminar type having a viscoelastic damping layer. The presence of this layer assists in reducing, that is damping, the bending motion of the substrate member thereby reducing the extent of cancellation which would normally be necessary. In addition to flexural energy minimization, compressional and sheer energy will also be more efficiently dissipated. The cancellation however, is also effective with just a single stiff metallic substrate member, in which case the arrangements of FIGS. 13 or 14 would be most advantageous since jumper leads 112 or 117 may be eliminated. A single metallic plate used in the arrangements of FIGS. 12 or 15 would require additional insulation layers between the element electrodes and the substrate member.

The metal layers of the tri-laminar substrate are separated by a very thin layer of a dielectric material (the viscoelastic damping layer). Thus a capacitor having a relatively high capacitance is formed in the electrical circuit with the effect of loading down the output signal in the arrangement of FIG. 12. Therefore for the directions of polarization and electrical connections of FIG. 12, a single, stiff, non-metallic plate would result in a more useful output signal.

The arrangement of FIG. 14 is preferred since it can be made with either a tri-laminar or single metal substrate which could act as a common electrical ground for all of the single input preamplifiers which would be utilized in a subarray.

Figure 16:
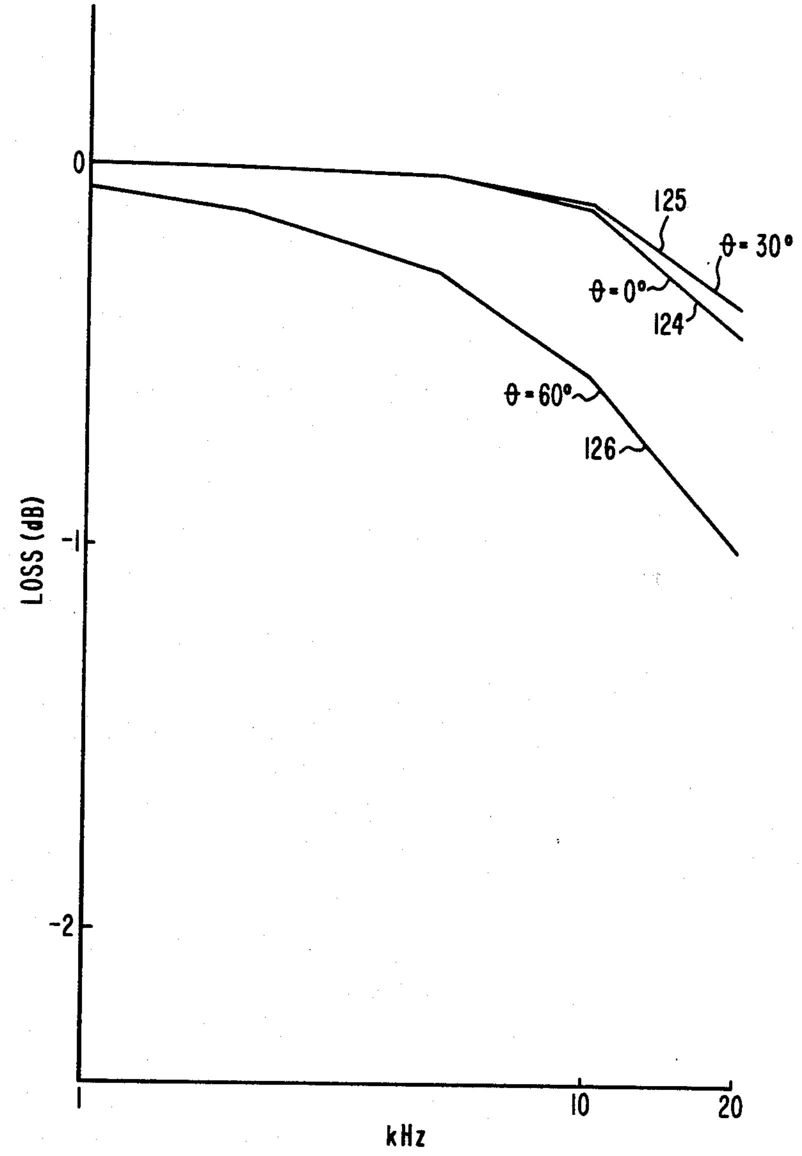
FIG. 16 are curves illustrating the transmissivity of acoustic energy through the hydrophone array.

Another important consideration in the design of the hydrophone array is its ability to reduce unwanted reflections. For this purpose, the array should be acoustically transparent so that incident acoustic energy passes through it to be absorbed elsewhere, if needed. The sandwich construction of the hydrophone of the present invention, although thicker than prior art designs, nevertheless meets this requirement for transparency. FIG. 16 illustrates the results of tests utilizing $PVF_2$ elements on opposite sides of a central aluminum plate. Within the frequency range of interest up to 20 kHz, the curves of FIG. 16, wherein frequency is plotted on the horizontal scale and loss in dB on the vertical scale, illustrate a maximum loss of only 1 dB of acoustic energy impinging on the array at three different angles of incidence of 0° (curve 124), 30° (curve 125) and 60° (curve 126).

Figure 17A:
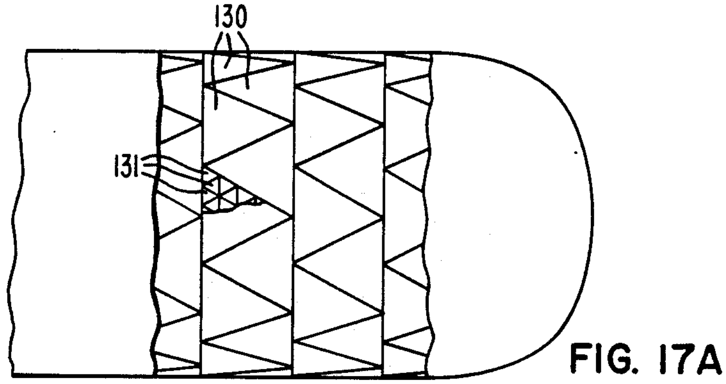
FIGS. 17A and 17B illustrate alternate geometric constructions for the array.
Figure 17B:
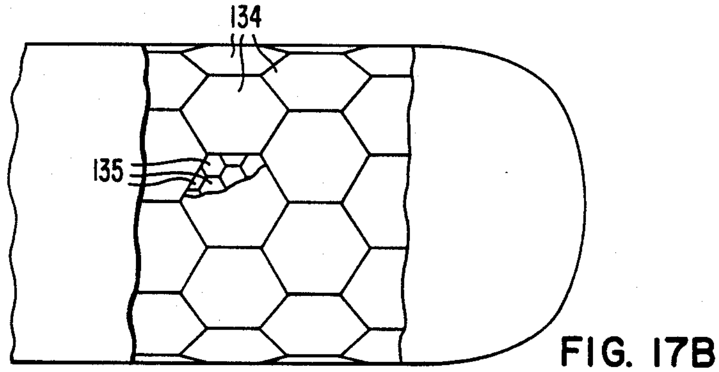

In FIG. 8, the hydrophone array was illustrated as being comprised of a plurality of subarrays in the form of rectangular mats having square piezoelectric polymer elements as in FIG. 7. Other geometrical shapes are equally applicable. For example, FIG. 17A illustrates a plurality of triangular mats 130 arranged on the hull of the underwater vessel, with one of the mats being broken away to reveal a plurality of triangular piezoelectric polymer elements 131. FIG. 17B illustrates a plurality of hexagonal mats 134 with one of the mats being broken away to reveal a plurality of hexagonally shaped piezoelectric polymer elements 135. Obviously, other geometrically shaped mats with corresponding piezoelectric polymer elements or combinations of shapes may be utilized.

Figure 18:
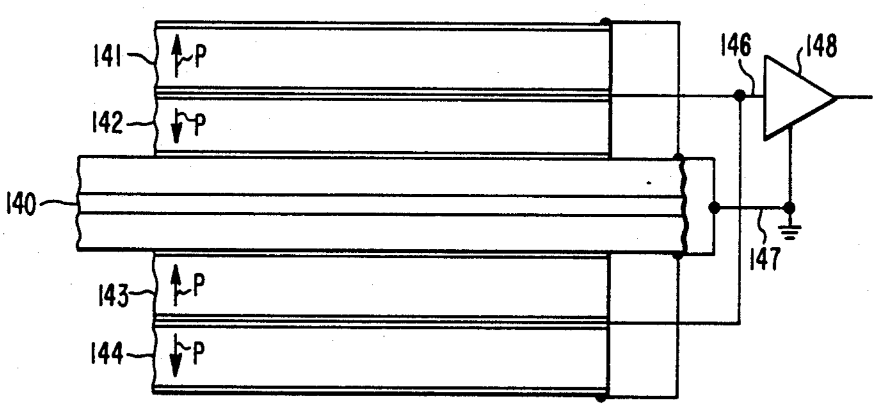
FIG. 18 illustrates another embodiment of the present invention.

FIG. 18 illustrates in an end cross-sectional view an alternate construction of hydrophone element in accordance with the teachings of the present invention. A substrate member 140 is provided and is identical to substrate member 20 previously described with respect to FIG. 5. Each side of the substrate member has a sandwich of a plurality of joined-together piezoelectric polymer elements. By way of example two elements, 141 and 142, are illustrated on the top side and two other elements, 143 and 144, on the bottom side, with each part of joined piezoelectric polymer elements being bonded to the substrate member by epoxy, or other relatively stiff adhesive. For the directions of polarization illustrated, the electrodes between the sandwiches are both electrically connected to the input 146 of single input preamplifier 148 while the outer electrodes and substrate member are connected to the input reference 147 of the preamplifier. In this manner, the outer electrodes are the low or ground side and would form an electromagnetic shield for the arrangement, thus eliminating the need for a separate wire shield as provided by metal wires 44 in FIG. 7.

Given the teachings presented herein, it is apparent that many modifications may be made while still coming within the spirit and scope of the invention. For example, electrodes are illustrated on both the top and bottom of a piezoelectric polymer element. Where bonding is made to a metallic substrate by a thin film of epoxy or other relatively stiff adhesive, the electrode may be eliminated in which case the metallic substrate would serve the dual function as both substrate and electrode for the polymer element. In this respect, one electrode between piezoelectric polymer elements bonded together as in FIG. 18 may also be eliminated.

Although the hydrophones making up the array are shown as being comprised of individual tiles on a common substrate, as in FIG. 7, a single sheet of piezoelectric polymer material, suitably electroded, may be bonded to either side of the substrate member and thereafter the exposed electrode surfaces may be appropriately scored to define individual hydrophone elements.

We claim:

1. Sonar apparatus comprising:
(A) an array of transducers;
(B) each said transducer of said array including
(i) a substrate member having a predetermined stiffness;
(ii) first and second piezoelectric elements, said elements being flexible relative to said substrate member;
(ii) each said piezoelectric element having a direction of polarization;
(iv) each said piezoelectric element having electrode means for electrical connection on opposed flat surfaces thereof;
(C) said first and second piezoelectric elements being affixed to said substrate member opposite one another on opposite surfaces thereof;
(D) conductors electrically connected to said electrode means for deriving an output signal when said piezoelectric elements are stressed;
(E) said conductors being connected to said electrode means in a manner that, for a predetermined relative orientation of said directions of polarization, said output signal will be minimal when one of said piezoelectric elements is in tension and the other in compression due to any bending or acceleration of said substrate member.

2. Apparatus according to claim 1 wherein:
(A) said piezoelectric elements are piezoelectric polymers each having a stretch direction;
(B) said stretch directions of said first and second elements being parallel to one another when said elements are affixed to said substrate member.

3. Apparatus according to claim 1 wherein:
(A) said substrate member is a metal;
(B) the Young's modulus of said metal being at least an order of magnitude greater than the Young's modulus of said piezoelectric elements.

4. Apparatus according to claim 1 wherein:
(A) said substrate member is of multi-laminar construction.

5. Apparatus according to claim 4 wherein:
(A) said multi-laminar construction includes two outer layers of metal and an inner layer of damping material.

6. Apparatus according to claim 5 wherein:
(A) said metal layers are of aluminum.

7. Apparatus according to claim 1 which includes:
(A) an acoustically transparent encapsulating material covering said piezoelectric elements.

8. Apparatus according to claim 7 which includes:
(A) an acoustically transparent electromagnetic interference shield positioned at a predetermined distance and being coextensive with said piezoelectric elements.

9. Apparatus according to claim 8 wherein:
(A) said shield is comprised of a plurality of metal wires embedded in said encapsulating material.

10. Apparatus according to claim 1 wherein:
(A) said array is comprised of a plurality of separate subarrays;
(B) each said transducer of a said subarray having a common substrate member with the other transducers of said subarray.

11. Apparatus according to claim 10 wherein:
(A) each said subarray is in the form of a polygon of n sides;
(B) each said piezoelectric element is in the form of a polygon of n sides.

12. Apparatus according to claim 11 wherein:
(A) said subarray is rectangular; and
(B) said piezoelectric elements are square.

13. Apparatus according to claim 11 wherein:
(A) said subarray is triangular; and
(B) said piezoelectric elements are triangular.

14. Apparatus according to claim 11 wherein:
(A) said subarray is hexagonal; and
(B) said piezoelectric elements are hexagonal.

15. Apparatus according to claim 1 wherein:
(A) said electrode means includes thin metal foil electrodes bonded to said piezoelectric elements.

16. Apparatus according to claim 1 which includes:
(A) at least third and fourth piezoelectric elements having electrodes on opposed surfaces thereof and being respectively bonded to said first and second piezoelectric elements;
(B) the exposed electrodes of said third and fourth piezoelectric elements being electrically connected together and to said substrate member to form an electrical ground so as to eliminate the need for any electromagnetic interference shield.

* * * * *